United States Patent [19]
Milkovic

[11] Patent Number: 4,808,942
[45] Date of Patent: Feb. 28, 1989

[54] CONTINUOUS MODE AUTO-ZERO OFFSET AMPLIFIER OR INTEGRATOR

[75] Inventor: Miran Milkovic, Scotia, N.Y.

[73] Assignee: General Electric Company, Schenectady, N.Y.

[21] Appl. No.: 177,242

[22] Filed: Apr. 4, 1988

[51] Int. Cl.$^4$ .............................. H03F 1/02; H03F 1/14
[52] U.S. Cl. ............................................. 330/9; 330/51
[58] Field of Search ..................... 307/491; 330/9, 51, 330/69, 107, 109, 307

[56] References Cited

U.S. PATENT DOCUMENTS 4,190,805  2/1980  Bingham ................................. 330/9
4,697,152  9/1987  Westwick ............................... 330/9

OTHER PUBLICATIONS

E. A. Goldberg, "Stabilization of Wide-Band Direct-Current Amplifiers for Zero and Gain", *RCA Review*, Jun., 1950, pp. 296–300.

J. A. C. Bingham, "Applications of a Direct-Transfer SC Integrator", *IEEE Transactions on Circuits and Systems*, vol. CAS-31, No. 4, Apr., 1984.

Primary Examiner—Steven Mottola
Attorney, Agent, or Firm—Marvin Snyder; James C. Davis, Jr.

[57] ABSTRACT

An error signal, i.e., offset, noise or drift, is sampled in an input capacitor at an error sampling interval and held during the amplification interval. During the amplification interval, the signal is amplified offset-free. The circuit has two paths which operate alternately in such a way that the signal path is never interrupted, except for very brief intervals. Each of the two paths includes an operational amplifier, and the offset voltages of the two operational amplifiers are cancelled out automatically.

10 Claims, 1 Drawing Sheet

CONTINUOUS MODE AUTO-ZERO OFFSET AMPLIFIER OR INTEGRATOR

BACKGROUND OF THE INVENTION

1. Field of the Invention

The present invention generally relates to operational amplifiers and, more particularly, to an amplifier or integrator wherein offset, noise and long-term drift are auto-zeroed in a continuous way.

2. Description of the Prior Art

The requirement which led to the invention was the need to develop analog amplifiers and integrators that allow signal processing and offset cancellation without interruption of the signal path. Various approaches have been used in the past to provide continuous offset correction. The most well known is chopper stabilization which requires external components and has a significant recovery period if overloaded. A basic article describing this approach to stabilization is "Stabilization of Wide-Band Direct-Current Amplifiers for Zero and Gain" by Edwin A. Goldberg published in RCA Review, June 1950, at pages 296 to 300. Another approach is to store the error signal on a capacitor as described by John A. C. Bingham in "Applications of a Direct-Transfer SC Integrator" published in *IEEE Trans. on Circuits and Systems*, vol. CAS-31, No. 4, April 1984, at pages 419 and 420. However, in this latter approach, the signal path is interrupted during the offset sample period, which is a disadvantage in many applications.

SUMMARY OF THE INVENTION

It is therefore an object of the present invention to provide a continuous mode auto-zero offset amplifier or integrator.

It is another object of the invention to provide an amplifier or integrator in which offset, noise and long-term drift are auto-zeroed in a continuous manner.

It is a further object of the invention to provide a continuous mode auto-zero amplifier which is readily implemented using metal oxide semiconductor (MOS) techniques.

According to the present invention, an error signal, i.e., offset, noise or drift, is sampled in a capacitor at an error sampling interval and held during the amplification interval. During that interval, the signal is amplified offset-free. The circuit has two paths which operate alternately in a manner such that the signal path is never interrupted, except for very brief intervals. Each of the two paths includes an amplifier, and the offset voltages of the two amplifiers are cancelled out automatically.

BRIEF DESCRIPTION OF THE DRAWINGS

The foregoing and other objects, aspects and advantages of the invention will be better understood from the following detailed description of a preferred embodiment of the invention with reference to the drawings, in which.

DETAILED DESCRIPTION OF A PREFERRED EMBODIMENT OF THE INVENTION

Figure 1:
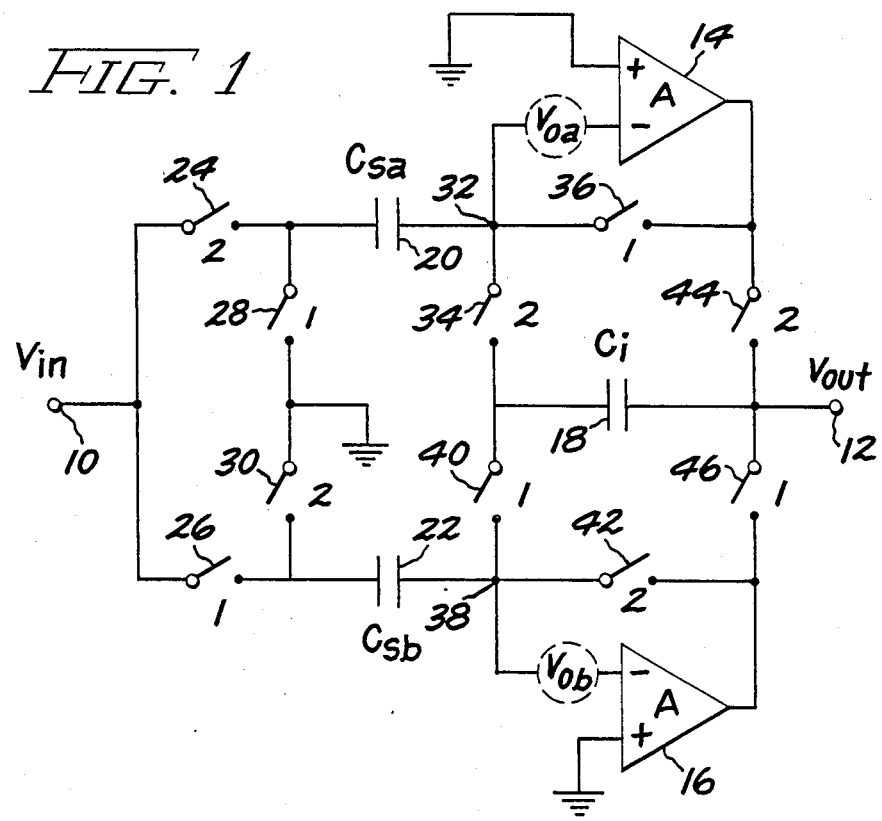
FIG. 1 is a schematic diagram of the circuit according to the invention.

As shown in FIG. 1, the circuit includes an input terminal 10 and an output terminal 12. The input splits into two paths, with an operational amplifier 14 and 16 situated in each path, respectively. As shown, these are differential amplifiers having positive and negative polarity inputs, with the positive polarity inputs of each amplifier being grounded. The two amplifiers 14 and 16 share a common feedback path via capacitor 18 to their negative polarity inputs; however, the capacitor 18 provides a feedback path alternately to the two amplifiers as controlled by switches, described in more detail below. In addition, each amplifier 14 and 16 has an input capacitor 20 and 22, respectively, connected to its negative polarity input.

Considering now the switching mechanism of the circuit, input terminal 10 is coupled to capacitor 20 via a switch 24 and to capacitor 22 via a switch 26. The junction between switch 24 and capacitor 20 is coupled to ground via a switch 28, and the junction between switch 26 and capacitor 22 is coupled to ground via a switch 30. Capacitor 20 is connected to a summing junction 32 which is, in turn, coupled to capacitor 18 via a switch 34, to the negative polarity input of amplifier 14, and to the output of amplifier 14 via a switch 36. Capacitor 22 is connected to a summing junction 38 which is, in turn, coupled to capacitor 18 via a switch 40, to the negative polarity input of amplifier 16, and to the output of amplifier 16 via a switch 42. The output of amplifier 14 is coupled to capacitor 18 and output terminal 12 via a switch 44, and the output of amplifier 16 is coupled to capacitor 18 and output terminal 12 via a switch 46. The voltage sources at the negative polarity inputs of each of amplifiers 14 and 16 are not physical circuit components but instead represent schematically the offset voltages of each amplifier, and hence are indicated by dashed outlines.

Those skilled in the art will recognize that the schematic diagram shown in FIG. 1 is merely illustrative of the actual circuit. The preferred embodiment contemplates implementation of the various circuit components in a single integrated circuit (IC). Thus, for example, each of the switches and capacitors is typically implemented using conventional metal oxide semiconductor (MOS) techniques and the operational amplifiers are implemented using similar techniques.

Figure 2:
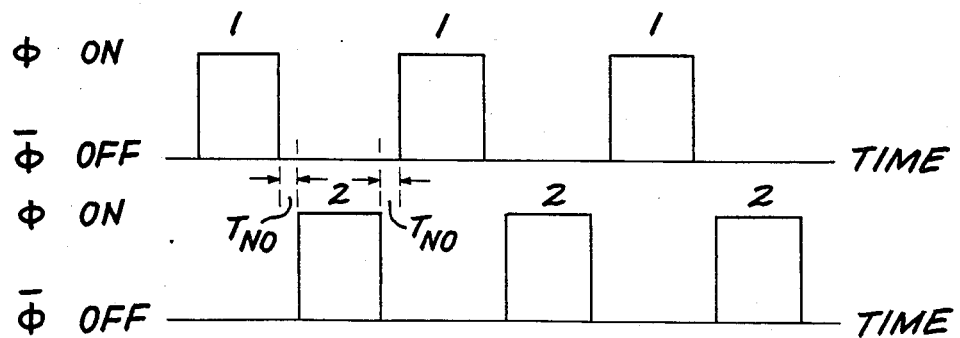
FIG. 2 is a timing diagram indicating the operation of the circuit in FIG. 1.

As shown in FIG. 1, the various switches have the notation of a "1" or a "2" adjacent the switch. These notations correspond to the clock phases shown in the timing diagram of FIG. 2 which operate the switches. Thus, when switch 24 is closed, connecting input 10 to capacitor 20, switch 26 is opened, disconnecting input 10 from capacitor 22, and so forth. Capacitors 20 and 22 are sampling capacitors, and capacitor 18 is a common feedback capacitor.

For an input voltage $V_{in}$ applied to input terminal 10, the output voltage at output terminal 12 is $V_{out} = -V_{in}C_s/C_i$, where $C_s$ is the sampling capacitance of capacitor 20 or 22 and $C_i$ is the capacitance of common feedback capacitor 18.

In operation, when the switches with notation "1" are ON (closed) and the switches with notation "2" are OFF (open), capacitor 20, having a capacitance $C_{sa}$, is charged to the offset voltage $V_{oa}$ of amplifier 14. At the same time, the signal $V_{in}$ is transferred via capacitor 22, having a capacitance $C_{sb}$, to capacitor 18. During that time, the offset voltage of amplifier 16 is compensated by the offset voltage $V_{ob}$ stored on capacitor 22 during the previous cycle, when the switches with the notation "2" were ON, so that amplifier 16 is thus auto-zeroed.

When the switches "1" are OFF and the switches "2" are ON, the signal $V_{in}$ is transferred to capacitor 18 via capacitor 20. At the same time, the offset voltage $V_{oa}$ of amplifier 14 is cancelled because the capacitor 20 was precharged to $V_{oa}$. Thus, signal charge is added each time to the charge on capacitor 18 but not the offset charge, thereby auto-zeroing amplifier 14. It will be observed in FIG. 2 that the two switching phases are separated by a small but finite "dead time", denoted $T_{NO}$. The purpose of this is to prevent simultaneous charging of the common feedback capacitor 18 by the two circuit paths.

A major advantage of this circuit is that it needs only a single feedback capacitor 18 to provide a non-interrupted signal flow. This allows a reduced cost for chip integration. The output signal depends on the matching of capacitor 18 and input capacitors 20 and 22, which is typically within about 0.2% since all capacitors are MOS capacitors integrated on the same chip.

Analyzing the circuit further, the output voltage (offsets neglected) is $$V_{out} = -Q[C_i(1+1/A)+C_s(1/A)]^{-1},$$

where A is the open loop gain of the operational amplifier and Q 32 $C_s V_{in}$. Since $A >> 1$, $$V_{out} = -V_{in}C_s/C_i,$$

as required. Thus, in the amplifier configuration of the circuit, the gain of the amplifier is determined by the ratio $C_s/C_i$. For example, for values $C_s=C_1$, the amplifier would have unitary gain.

The circuit shown in FIG. 1 can also be used as an integrator if the phases of operation of switches 24, 26, 28, and 30 are reversed; that is, switches 24 and 30 are ON during each clock phase "1" and switches 26 and 28 are ON during each clock phase "2". In that case, capacitors $C_{sa}$ and C are alternately charged to voltage levels $V_{in}+V_{oa}$ and $V_{in}+V_{ob}$, respectively, during a combined sampling and autozero mode for the respective amplifier. During the following integrating mode, the charge is transferred from $C_{sa}$ or $C_{sb}$ to $C_i$, while the offsets are corrected at the same time. The output of the integrator is $$V_{out} = -SCL \; C_s/j\omega C_i,$$

where SCL is the sampling clock rate and $\omega$ is the angular frequency of $2\pi f$.

While the invention has been described in terms of a single preferred embodiment, those skilled in the art will appreciate that the invention can be practiced with modification within the spirit and scope of the appended claims. It is, therefore to be understood that the appended claims are intended to cover all such modifications and changes as fall within the true spirit of the invention.

Having thus described my invention, what I claim as new and desire to secure by Letters Patent is as follows:

1. A continuous mode auto-zero offset amplifier comprising:
   an input terminal, an output terminal, and first and second circuit paths extending between said input terminal and said output terminal;
   first and second operational amplifiers respectively connected in said first and second circuit paths, each of said first and second operational amplifiers having a summing junction and an input capacitor connected to said summing junction;
   a feedback capacitor; and
   switching means for coupling to a reference voltage in an alternate manner one or the other input capacitor of said first and second amplifiers, for coupling said output terminal in an alternate manner to one or an other output of said first and second amplifiers, and for coupling said feedback capacitor in an alternate manner between the output and the summing junction of one or the other of said first and second amplifiers, respectively, so as to charge the input capacitor of said first and second amplifiers, respectively, to an error voltage in an alternate manner.

2. The continuous mode auto-zero offset amplifier as recited in claim 1 wherein said switching means includes:
   first and second switches for coupling said input terminal, respectively, to one or the other input capacitor of said first and second amplifiers, respectively, in an alternate manner.

3. The continuous mode auto-zero offset amplifier as recited in claim 2 wherein one side of said feedback capacitor is connected to said output terminal, said switching means further including:
   third and fourth switches for alternately coupling said output terminal, respectively, to one or the other of said outputs of said first and second amplifiers, respectively; and
   fifth and sixth switches for alternately coupling the other side of said feedback capacitor, respectively, to one or the other of said summing junctions of said first and second amplifiers, respectively.

4. The continuous mode auto-zero offset amplifier as recited in claim 3 wherein said switching means further comprises:
   seventh and eighth switches for alternately coupling said reference voltage to one or the other input capacitor, respectively, of said first and second amplifiers, respectively, when said one or the other input capacitor is disconnected from said input terminal; and
   ninth and tenth switches for alternately connecting the output of either of said first and second amplifiers disconnected from said output terminal to the summing junction of said either of said first and second operational amplifiers, respectively.

5. The continuous mode auto-zero offset amplifier as recited in claim 1 wherein said operational amplifiers are fabricated on a common integrated circuit chip with said capacitors and said switching means.

6. A continuous mode auto-zero offset integrator having an input terminal and an output terminal, and first and second circuit paths extending between said input terminal and said output terminal said integrator comprising:
   first and second operational amplifier respectively connected on said first and second circuit paths each of said operational amplifiers having a summing junction and an input capacitor connected to said summing junction, respectively;
   a feedback capacitor; and
   switching means for coupling to a reference voltage in an alternate manner one or the other input capacitor of said second and first amplifiers, for coupling said output terminal in an alternate manner to one or an other output of said first and second amplifiers, and for coupling said feedback capacitor in an alternate manner between the output and the summing junction of one or the other of said first and second amplifiers, respectively, so as to charge the input capacitor of said first and second amplifiers, respectively, to an error voltage in an alternate manner.

7. The continuous mode auto-zero offset integrator as recited in claim 6 wherein said switching means includes:
first and second switches for coupling said input terminal, respectively, to one or the other input capacitor of said first and second amplifiers, respectively, in an alternate manner.

8. The continuous mode auto-zero offset integrator as recited in claim 7 wherein one side of said feedback capacitor is connected to said output terminal, said switching means further including:
third and fourth switches for alternately coupling said output terminal, respectively, to one or the other of said outputs of said first and second amplifiers, respectively; and
fifth and sixth switches for alternately coupling the other side of said feedback capacitor, respectively, to one or the other of said summing junctions of said first and second amplifiers, respectively.

9. The continuous mode auto-zero offset integrator as recited in claim 8 wherein said switching means further comprises:
seventh and eighth switches for alternately coupling said reference voltage to one or the other input capacitor, respectively, of said first and second amplifiers, respectively, when said one or the other input capacitor is disconnected from said input terminal; and
ninth and tenth switches for alternately connecting the output of either of said first and second amplifiers disconnected from said output terminal to the summing junction of said either of said operational amplifiers, respectively.

10. The continuous mode auto-zero offset integrator as recited in claim 6 wherein said operational amplifiers are fabricated on a common integrated circuit chip with said capacitors and said switching means.

* * * * *